(12) United States Patent
Kang et al.

(10) Patent No.: US 8,092,981 B2
(45) Date of Patent: Jan. 10, 2012

(54) NEGATIVE PHOTORESIST COMPOSITION AND METHOD OF MANUFACTURING ARRAY SUBSTRATE USING THE SAME

(75) Inventors: Hoon Kang, Suwon-si (KR); Jae-Sung Kim, Yongin-si (KR); Yang-Ho Jung, Yongin-si (KR); Hi-Kuk Lee, Yongin-si (KR); Yasuhiro Kameyama, Yokohama (JP); Yuuji Mizuho, Yokohama (JP); Jong-Cheol Kim, Suwon-si (KR); Se-Jin Choi, Yongin-si (KR)

(73) Assignees: Samsung Electronics Co., Ltd. (KR); Techno Semichem Co., Ltd. (KR)

( * ) Notice: Subject to any disclaimer, the term of this patent is extended or adjusted under 35 U.S.C. 154(b) by 194 days.

(21) Appl. No.: 12/345,169

(22) Filed: Dec. 29, 2008

(65) Prior Publication Data

US 2009/0176337 A1 Jul. 9, 2009

(30) Foreign Application Priority Data

Jan. 4, 2008 (KR) ........................ 10-2008-0001246

(51) Int. Cl.
*G03F 7/027* (2006.01)
*G03F 7/038* (2006.01)
*G03F 7/004* (2006.01)
*G03F 7/028* (2006.01)
*H01L 21/336* (2006.01)
*H01L 21/84* (2006.01)

(52) U.S. Cl. .................. 430/285.1; 430/910; 430/284.1; 430/288.1; 430/281.1; 430/280.1; 522/102

(58) Field of Classification Search .................. None
See application file for complete search history.

(56) References Cited

U.S. PATENT DOCUMENTS

| 4,933,259 A * | 6/1990 | Chihara et al. ............. 430/280.1 |
| 5,723,262 A * | 3/1998 | Nakamura et al. ......... 430/286.1 |
| 5,948,514 A * | 9/1999 | Komori et al. ................ 428/209 |
| 6,316,172 B1 * | 11/2001 | Hashimoto ................... 430/350 |
| 2003/0153723 A1 * | 8/2003 | Nishikubo et al. ............. 528/327 |

FOREIGN PATENT DOCUMENTS

| DE | 2809676 A | * | 9/1979 |
| JP | 61-35883 A | * | 2/1986 |
| JP | 2003188183 A | | 7/2003 |
| JP | 2008-52251 A | * | 3/2008 |
| KR | 1020040093972 A | | 11/2004 |
| KR | 1020050071885 A | | 7/2005 |
| KR | 1020060128715 A | | 12/2006 |

OTHER PUBLICATIONS

English translation of JP, 2008-52251, A (2008) from machine translation from AIPN Japan Patent Office National center for Industrial Property Information and Training, generated Nov. 20, 2010, 48 pages.*

* cited by examiner

*Primary Examiner* — Cynthia Hamilton
(74) *Attorney, Agent, or Firm* — Cantor Colburn LLP

(57) ABSTRACT

A negative photoresist composition and a method of manufacturing an array substrate. The negative photoresist composition includes a photocurable composition including an ethylene unsaturated compound containing an ethylene unsaturated bond and a photopolymerization initiator, a thermosetting composition including an alkali-soluble resin crosslinked by heat and an organic solvent. The negative photoresist composition improves stability, photosensitivity, detachability after performing a developing operation and reduces residue to improve the reliability of an organic insulation layer. Furthermore, the negative photoresist composition improves the transmittance of an organic insulation layer and reduces the variation of color coordinates to improve the display quality of a display apparatus.

7 Claims, 3 Drawing Sheets

NEGATIVE PHOTORESIST COMPOSITION AND METHOD OF MANUFACTURING ARRAY SUBSTRATE USING THE SAME

This application claims priority to Korean Patent Application No. 2008-0001246, filed on Jan. 4, 2008, and all the benefits accruing therefrom under 35 U.S.C. §119, the contents of which in its entirety are incorporated herein by reference.

BACKGROUND OF THE INVENTION

1. Field of the Invention

The present invention relates to a negative photoresist composition and a method of manufacturing an array substrate using the negative photoresist composition. More particularly, the present invention relates to a negative photoresist composition which can be utilized for an organic insulation layer of a liquid crystal display ("LCD") apparatus and a method of manufacturing an array substrate using the negative photoresist composition.

2. Description of the Related Art

A conventional LCD apparatus includes an array substrate having a thin-film transistor ("TFT") which is a switching element for operating a pixel of a display panel of the LCD apparatus. The TFT is protected by a passivation layer. An organic insulation layer is formed on the passivation layer to planarize a substrate, to thereby improve resistive-capacitive ("RC") delay and an aperture ratio.

Compositions which are used for the organic insulation layer include a positive photoresist composition and a negative photoresist composition. The positive photoresist composition includes a 1,2-quinone diazide compound as a photosensitizer. However, the 1,2-quinone diazide compound is heated when forming an organic insulation layer so that the 1,2-quinone diazide compound is of a red color. Thus, the light transmittance of a pixel with respect to visible light is reduced.

The negative photoresist composition is not discolored like the positive photoresist composition, and has high photosensitivity compared to the positive photoresist composition. However, a developing solution easily causes swelling in the negative photoresist composition in a developing operation after an exposure operation has been performed. Thus, the resolution and adhesion between an organic insulation layer and a substrate is reduced. In order to solve the problems of the negative photoresist composition, solubility and the affinity of the organic insulation layer with respect to a developing solution have been reduced.

However, reducing the solubility and the affinity of the organic insulation layer with respect to a developing solution can cause problems, for example, in that detachability may be reduced, and residue may be formed. Thus, the display quality of the LCD apparatus may be reduced.

BRIEF SUMMARY OF THE INVENTION

The present invention has made an effort to solve the above stated problems, and aspects of the present invention provide a negative photoresist composition capable of improving photosensitivity, and a method of manufacturing an array substrate using the above-mentioned negative photoresist composition.

In an exemplary embodiment, the present invention provides a negative photoresist composition which includes a photocurable composition including an ethylene unsaturated compound containing an ethylene unsaturated bond and a photopolymerization initiator, a thermosetting composition including an alkali-soluble resin crosslinked by heat and an organic solvent.

According to an exemplary embodiment, the thermosetting composition further includes a thermal crosslinker.

According to an exemplary embodiment, the photopolymerization initiator generates a radical in response to light having a wavelength of approximately 300 nm to approximately 450 nm.

In another exemplary embodiment, the present invention provides a method of manufacturing an array substrate, the method including forming a gate pattern including a gate line and a gate electrode on a base substrate, forming a source pattern on the base substrate having the gate pattern, the source pattern including a data line, a source electrode and a drain electrode spaced apart from the source electrode, forming an organic insulation layer on the base substrate having the source pattern by coating a negative photoresist composition including a photocurable composition including an ethylene unsaturated compound containing an ethylene unsaturated bond and a photopolymerization initiator, a thermosetting composition including an alkali-soluble resin crosslinked by heat and an organic solvent, and forming a pixel electrode on the organic insulation layer, the pixel electrode being electrically connected to the drain electrode.

According to an exemplary embodiment, forming the organic insulation layer includes exposing the negative photoresist composition coated on the base substrate to light, and developing the negative photoresist composition.

According to an exemplary embodiment, the light includes a wavelength of approximately 300 nm to approximately 450 nm.

According to an exemplary embodiment, forming the organic insulation layer further includes heating the negative photoresist composition after developing the negative photoresist composition.

According to an exemplary embodiment, heating the negative photoresist composition is performed at a temperature of approximately 200° C. to approximately 300° C.

According to an exemplary embodiment, the organic insulation layer includes an opening corresponding to an end of the drain electrode.

According to an exemplary embodiment, the method further includes forming a passivation layer between the source pattern and the organic insulation layer, and removing a portion of the passivation layer by using the organic insulation layer having the opening as an etching mask to expose the drain electrode.

According to the above-described exemplary embodiments, a negative photoresist composition according to an exemplary embodiment of present invention improves stability, photosensitivity, resolution, pattern adhesion and detachability and is capable of forming a pattern having a desired shape. Furthermore, the negative photoresist composition reduces residue to improve the reliability of an organic insulation layer.

Furthermore, improved photosensitivity of the negative photoresist composition reduces the time required for an exposure process to improve manufacturing efficiencies.

Furthermore, the negative photoresist composition improves the transmittance of an organic insulation layer and reduces the variation of color coordinates to improve the display quality of a display apparatus.

BRIEF DESCRIPTION OF THE DRAWINGS

The above and/or other aspects, features and advantages of the present invention will become more apparent from the following detailed description when taken in conjunction with the accompanying drawings, in which.

DETAILED DESCRIPTION OF THE INVENTION

Figure 1:
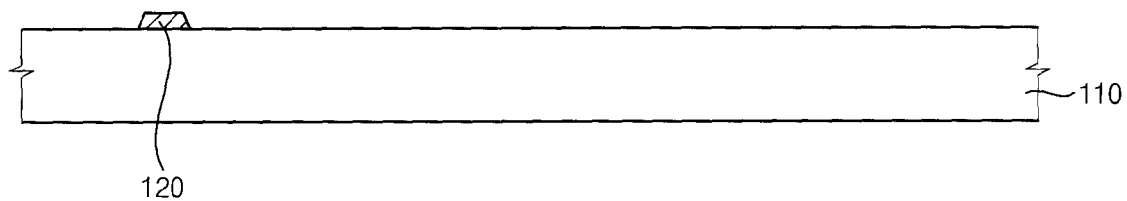
FIG. 1 is a cross-sectional view illustrating an exemplary embodiment of an operation of forming a gate pattern of a method of manufacturing an array substrate according to the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, for the purpose of illustration only, "(meth)acryl" will represent "acryl" and/or "methacryl."

A photoresist composition according to an exemplary embodiment of the present invention includes a photocurable composition including an ethylene unsaturated compound containing an ethylene unsaturated bond and a photopolymerization initiator, a thermosetting composition including an alkali-soluble resin crosslinked by heat, and an organic solvent.

In the photocurable composition, the ethylene unsaturated compound includes at least one ethylene unsaturated bond. The ethylene unsaturated bond of the ethylene unsaturated compound is reacted with a radical generated by the photopolymerization initiator so as to initiate polymerization so that the ethylene unsaturated compound is photopolymerized.

According to an exemplary embodiment, the ethylene unsaturated compound includes unsaturated carboxylic acids, unsaturated carboxylic esters, (meth)acrylonitriles, (meth)acrylamides and the like. According to an exemplary embodiment, the unsaturated carboxylic acids includes (meth)acrylic acid, crotonic acid, isocrotonic acid, maleic acid, itaconic acid, citraconic acid and the like. The unsaturated carboxylic esters includes (meth)acrylic ester, crotonic ester, isocrotonic ester, maleic ester, itaconic ester, citraconic ester and the like. According to an exemplary embodiment, these can be used alone or in a combination thereof.

Furthermore, according to an exemplary embodiment, the ethylene unsaturated compound includes a synthetic product of unsaturated carboxylic acids and polyhydroxyl compounds, (meth)acryloyloxy group-containing phosphates, urethane (meth)acrylates, epoxy(meth)acrylates and the like. These can be used alone or in a combination thereof. According to an exemplary embodiment, the synthetic product of unsaturated carboxylic acids and polyhydroxyl compounds includes (meth)acrylates, crotonates, isocrotonates, maleates, itaconates, citraconates and the like. These can be used alone or in a combination thereof.

According to an exemplary embodiment, the (meth)acrylates includes ethylene glycol(meth)acrylate, diethylene glycol di(meth)acrylate, propylene glycol di(meth)acrylate, trimethylol propane di(meth)acrylate, trimethylol propane tri(meth)acrylate, trimethylol propane ethylene oxide-added tri(meth)acrylate, glycerol di(meth)acrylate, glycerol tri(meth)acrylate, glycerol propane ethylene oxide-added tri(meth)acrylate, pentatrierythritol di(meth)acrylate, pentatrierythritol tri(meth)acrylate, pentatrierythritol tetra(meth)acrylate, dipentatrierythritol penta(meth)acrylate, dipentatrierythritol hexa(meth)acrylate, bisphenol-A di(meth)acrylate, bisphenol-A bis[oxyethylene(meth)acrylate], bisphenol-A bis[glycidyl ether(meth)acrylate] and the like. These can be used alone or in a combination thereof.

According to an exemplary embodiment, the crotonates includes ethylene glycol crotonate, diethylene glycol dicrotonate, propylene glycol dicrotonate, trimethylol propane dicrotonate, trimethylol propane tricrotonate, trimethylol propane ethylene oxide-added tricrotonate, glycerol dicrotonate, glycerol tricrotonate, glycerol propane ethylene oxide-added tricrotonate, pentatrierythritol dicrotonate, pentatrierythritol tricrotonate, pentatrierythritol tetracrotonate, dipentatrierythritol pentacrotonate, dipentatrierythritol hexacrotonate, bisphenol-A dicrotonate, bisphenol-A bis[oxyethylene crotonate], bisphenol-A bis[glycidyl ether crotonate] and the like. These can be used alone or in a combination thereof.

According to an exemplary embodiment, the isocrotonates includes ethylene glycol isocrotonate, diethylene glycol diisocrotonate, propylene glycol diisocrotonate, trimethylol propane diisocrotonate, trimethylol propane triisocrotonate, trimethylol propane ethylene oxide-added triisocrotonate, glycerol diisocrotonate, glycerol triisocrotonate, glycerol propane ethylene oxide-added triisocrotonate, pentatrierythritol diisocrotonate, pentatrierythritol triisocrotonate, pentatrierythritol tetraisocrotonate, dipentatrierythritol pentaisocrotonate, dipentatrierythritol hexaisocrotonate, bisphenol-A diisocrotonate, bisphenol-A bis[oxyethylene isocrotonate], bisphenol-A bis[glycidyl ether isocrotonate] and the like. These can be used alone or in a combination thereof.

According to an exemplary embodiment, the maleates includes ethylene glycol maleate, diethylene glycol dimaleate, propylene glycol dimaleate, trimethylol propane dimaleate, trimethylol propane trimaleate, trimethylol propane ethylene oxide-added trimaleate, glycerol dimaleate, glycerol trimaleate, glycerol propane ethylene oxide-added trimaleate, pentatrierythritol dimaleate, pentatrierythritol trimaleate, pentatrierythritol tetramaleate, dipentatrierythritol pentamaleate, dipentatrierythritol hexamaleate, bisphenol-A dimaleate, bisphenol-A bis[oxyethylene maleate], bisphenol-A bis[glycidyl ether maleate] and the like. These can be used alone or in a combination thereof.

According to an exemplary embodiment, the itaconates includes ethylene glycol itaconate, diethylene glycol diitaconate, propylene glycol diitaconate, trimethylol propane diitaconate, trimethylol propane triitaconate, trimethylol propane ethylene oxide-added triitaconate, glycerol diitaconate, glycerol triitaconate, glycerol propane ethylene oxide-added triitaconate, pentatrierythritol diitaconate, pentatrierythritol triitaconate, pentatrierythritol tetraitaconate, dipentatrierythritol pentaitaconate, dipentatrierythritol hexaitaconate, bisphenol-A diitaconate, bisphenol-A bis[oxyethylene itaconate], bisphenol-A bis[glycidyl ether itaconate] and the like. These can be used alone or in a combination thereof.

According to an exemplary embodiment, the citraconates includes ethylene glycol citraconate, diethylene glycol dicitraconate, propylene glycol dicitraconate, trimethylol propane dicitraconate, trimethylol propane tricitraconate, trimethylol propane ethylene oxide-added tricitraconate, glycerol dicitraconate, glycerol tricitraconate, glycerol propane ethylene oxide-added tricitraconate, pentatrierythritol dicitraconate, pentatrierythritol tricitraconate, pentatrierythritol tetracitraconate, dipentatrierythritol pentacitraconate, dipentatrierythritol hexacitraconate, bisphenol-A dicitraconate, bisphenol-A bis[oxyethylene citraconate], bisphenol-A bis[glycidyl ether citraconate] and the like. These can be used alone or in a combination thereof.

According to an exemplary embodiment, the (meth)acryloyloxy group-containing phosphates includes (meth)acryloyloxyethylene phosphate, bis[(meth)acryloyloxyethylene] phosphate, (meth)acryloyloxyethylene glycol phosphate and the like. These can be used alone or in a combination thereof.

According to an exemplary embodiment, the urethane (meth)acrylates includes a synthetic product of a hydroxy (meth)acrylate compound and a polyisocyanate compound. Particularly, according to an exemplary embodiment the urethane(meth)acrylates includes UX-2201, UX-3204, UX-4101, UX-6101, UX-7101, UX-8101 (trade name, manufactured by Nippon Chemical Industrial Co., Ltd., Japan), UN-7200A, UN-55200A, UN-7600, UN-3320HS (trade name, manufactured by Negami Chemical Industrial Co., Ltd., Japan), Ebecryl 210, Ebecryl 220, Ebecryl 230, Ebecryl 270, Ebecryl 1290 (trade name, manufactured by Daicel-Cytec Company, Ltd., Japan), AGROR4060 (trade name, manufactured by Bayer Japan, Japan) and the like. These can be used alone or in a combination thereof.

According to an exemplary embodiment, the epoxy(meth) acrylates includes a synthetic product of a polyepoxy compound and a (meth)acrylic acid or a hydroxy(meth)acrylate. Particularly, according to an exemplary embodiment, the epoxy(meth)acrylates include R-115, R-130, ZAR-1035, ZFR-1122, ZFR-1401H (trade name, manufactured by Nippon Chemical Industrial Co., Ltd., Japan), Epoxy Ester 40EM, Epoxy Ester 70PA, Epoxy Ester 200PA, Epoxy Ester 80MFA, Epoxy Ester 3002M, Epoxy Ester 3002A, Epoxy Ester 3000M, Epoxy Ester 3000A (trade name, manufactured by Kyoeisha Chemical Co., Ltd., Japan), DA-111, DA-212, DA-250, DA-314, DA-721, DA-722, DA-911M, DA-920, DA-931, DA-201, DM-811, DM-832, DM-851 (trade name, manufactured by Nagase ChemteX Corp., Japan), Ebecryl 3700, Ebecryl 3708 (trade name, manufactured by Daicel-Cytec Company, Ltd., Japan) and the like. These can be used alone or in a combination thereof.

Each of the ethylene unsaturated compounds includes at least two ethylene unsaturated bonds in view of polymerization, crosslinking, etc. According to an exemplary embodiment, the ethylene unsaturated compounds include (meth)acrylates, (meth)acryloyloxy group-containing phosphates, urethane(meth)acrylates and the like, which contain at least two (meth)acrylate groups. More preferably, examples of the ethylene unsaturated compounds may include bisphenol-A di(meth)acrylate, bisphenol-A bis[oxyethylene(meth)acrylate], bisphenol-A bis[glycidyl ether(meth)acrylate] and the like. These can be used alone or in a combination thereof.

In an exemplary embodiment, the ethylene unsaturated compound include a compound represented by the following Chemical Formula 1.

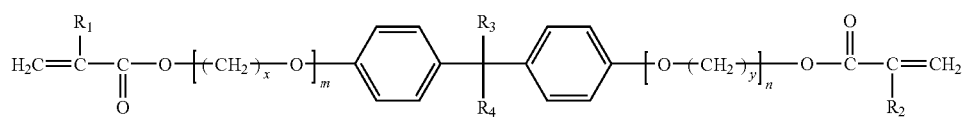

<Chemical Formula 1>

In Chemical Formula 1, $R_1$, $R_2$, $R_3$ and $R_4$ independently represent a hydrogen atom or an alkyl group having 1 to 4 carbon atoms (where x and y independently represent a natural number of 1 to 10, and m and n independently represent a natural number of 1 to 10). According to an exemplary embodiment, the alkyl group includes a methyl group, an ethyl group, an n-propyl group, an isopropyl group, an n-butyl group, an isobutyl group, a t-butyl group, etc.

Alternatively, according to another exemplary embodiment, the ethylene unsaturated compound include a compound represented by the following Chemical Formula 2.

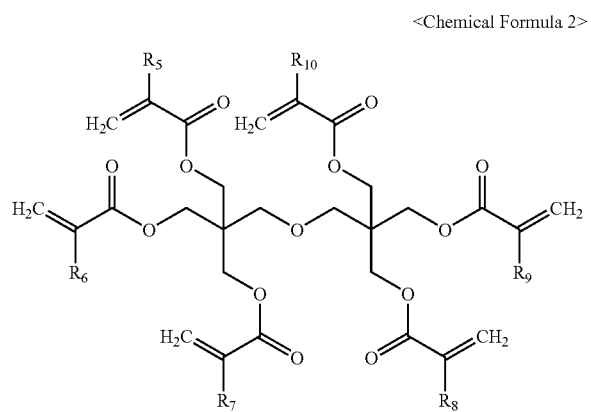

<Chemical Formula 2>

In Chemical Formula 2, $R_5$, $R_6$, $R_7$, $R_8$, $R_9$ and $R_{10}$ independently represent a hydrogen atom or an alkyl group having 1 to 4 carbon atoms. According to an exemplary embodiment, the alkyl group include a methyl group, an ethyl group, an n-propyl group, an isopropyl group, an n-butyl group, an isobutyl group, a t-butyl group, etc.

Alternatively, according to another exemplary embodiment, the ethylene unsaturated compound include a compound represented by the following Chemical Formula 3.

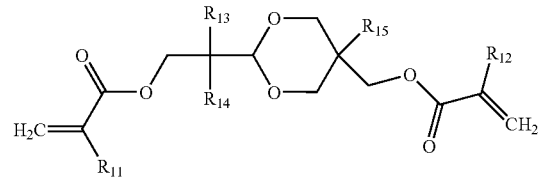

<Chemical Formula 3>

In Chemical Formula 3, $R_{11}$, $R_{12}$, $R_{13}$, $R_{14}$ and $R_{15}$ independently represent a hydrogen atom or an alkyl group having 1 to 4 carbon atoms. According to an exemplary embodiment, the alkyl group include a methyl group, an ethyl group, an n-propyl group, an isopropyl group, an n-butyl group, an isobutyl group, a t-butyl group, etc.

According to an exemplary embodiment, when the content of the ethylene unsaturated compound is less than approximately 70% by weight based on a total weight of the photocurable composition, the photosensitivity of the negative photoresist composition is reduced. According to an exemplary embodiment, when the content of the ethylene unsaturated compound is more than approximately 99.5%, the shape reproducibility of a cross-section of a pattern is reduced, and a residual rate is also reduced. Thus, the content of the ethylene unsaturated compound is within a range of approximately 70% to approximately 99.5% by weight based on the total weight of the photocurable composition. According to the current exemplary embodiment, the content of the ethylene unsaturated compound is within a range of approximately 80% to approximately 99% by weight based on the total weight of the photocurable composition.

According to an exemplary embodiment, the photopolymerization initiator generates a radical by being exposed to light to polymerize the ethylene unsaturated compound. The photopolymerization initiator maximally absorbs light having a predetermined wavelength, which is generated by an exposure device used in an exposure operation. For example, according to an exemplary embodiment of the present invention, the photopolymerization initiator efficiently absorbs light having a wavelength of approximately 300 nm to approximately 450 nm to generate a radical.

According to an exemplary embodiment, the photopolymerization initiator includes halomethylated triazine derivatives such as 2-(4-methoxyphenyl)-4,6-bis(trichloromethyl)-s-triazine, 2-(4-methoxynaphthyl)-4,6-bis(trichloromethyl)-s-triazine, 2-(4-ethoxynaphthyl)-4,6-bis(trichloromethyl)-s-triazine, 2-(4-ethoxycarbonylnaphthyl)-4,6-bis(trichloromethyl)-s-triazine and the like; halomethylated oxadiazole derivatives; imidazole derivatives such as 2-(o-chlorophenyl)-4,5-diphenylimidazole dimer, 2-(o-chlorophenyl)-4,5-bis(3'-methoxyphenyl)imidazole dimer, 2-(o-fluorophenyl)-4,5-diphenylimidazole dimer, 2-(o-methylphenyl)-4,5-diphenylimidazole dimer, 2-(o-methoxyphenyl)-4,5-diphenylimidazole dimer and the like; benzoin, benzoin alkyl ethers such as benzoinmethyl ether, benzoinphenyl ether, benzoinisobutyl ether, benzoinisopropyl ether and the like; anthraquinone derivatives such as 2-methylanthraquinone, 2-ethylanthraquinoe, 2-t-butylanthraquinone, 1-chloroanthraquinone and the like; benzanthrone derivatives; benzophenone derivatives such as benzophenone, Michler's ketone, 2-methylbenzophenone, 3-methylbenzophenone, 4-methylbenzophenone, 2-chlorobenzophenone, 4-bromobenzophenone, 2-carboxybenzophenone and the like; acetophenone derivatives such as 2,2-dimethoxy-2-phenylacetophenone, 2,2-diethoxyacetophenone, 1-hydroxycyclohexylphenyl ketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone, 1,1,1-trichloromethyl-(p-butylphenyl)ketone and the like; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone, 2,4-diisopropylthioxanthone and the like; benzoic acid ester derivatives such as ethyl p-dimethylaminobenzoate, ethyl p-diethylaminobenzoate and the like; acridine derivatives such as 9-phenylacridine, 9-(p-methoxyphenyl) acridine and the like; phenadine derivatives such as 9,10-dimethylbenzphenadine and the like; titanocene derivatives such as di-cyclopentadienyl-Ti-dichloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-2,6-di-fluorophen-1-yl, di-cyclopentadienyl-Ti-2,4-di-fluorophen-1-yl, di-methylcyclopentadienyl-Ti-bis-2,3,4,5,6-pentafluorophen-1-yl, di-methylcyclopentadienyl-Ti-bis-2,6-di-fluorophen-1-yl, di-cyclopentadienyl-Ti-2,6-di-fluoro-3-(pyr-1-yl)-phen-1-yl, and the like; a-aminoalkylphenone compounds such as 2-methyl-1-[4-(methylthio)phenyl]-2-morpholinopropane-1-yl, 2-benzyl-2-dimethylamino-1-(4-morpholinophenyl) butanone-1-on, 2-benzyl-2dimethylamino-1-(4-morpholinophenyl)butane-1-on, 4-dimethylaminoethylbenzoate, 4-dimethylaminopropiophenone, 2-ethylhexyl-1,4-dimethylaminobenzoate, 2,5-bis(4-biethylaminobenzal)cyclohexanone, 7-diethylamino-3-(4-diethylaminobenzoyl)cumarine, 4-(diethylamino)chalcone and the like; acylphosphineoxide compounds such as 2,4,6-trimethylbenzoyl-diphenyl-phosphine oxide, bis(2,4,6-trimethylbenzoyl)-phenylphosphine oxide and the like; oxime ester compounds such as 1,2-octanedione, 1-[4-(phenylthio)phenyl]-2-(o-benzoyloxime), ethanone and the like. These can be used alone or in a combination thereof.

According to an exemplary embodiment, when the content of the photopolymerization initiator is less than approximately 0.5% by weight based on the total weight of the photocurable composition, the photosensitivity of the negative photoresist composition is reduced. Further, according to an exemplary embodiment, when the content of the photopolymerization initiator is more than approximately 30%, a residue is formed. Thus, the content of the photopolymerization initiator is approximately 0.5% to approximately 30% by weight based on the total weight of the photocurable composition. According to an exemplary embodiment, the content of the photopolymerization initiator is approximately 1% to approximately 20% by weight.

Regarding the thermosetting composition, the alkali-soluble resin is crosslinked by heat, and is soluble in an alkaline solvent. According to an exemplary embodiment, the alkali-soluble resin does not include an epoxy group having two carbon atoms and one oxygen atom, which form a triangular shape. The alkali-soluble resin includes a cross-likable substituent, such as a carboxyl group, a hydroxyl group, for example. The alkali-soluble resin is crosslinked by heat provided in an exposure operation. According to an exemplary embodiment, the thermosetting composition further includes a thermal crosslinker which allows a crosslink to be easily formed.

According to an exemplary embodiment, the alkali-soluble resin include a copolymer prepared by reacting a first group including (meth)acrylic acid, p-hydroxystyrene, m-hydroxystyrene, o-hydroxystyrene, 2-hydroxyethyl(meth)acrylate and the like with a second group including styrene; a-methylstyrenes; alkyl(meth)acrylates containing an alkyl group such as methyl(meth)acrylate, ethyl(meth)acrylate, n-propyl (meth)acrylate, n-butyl(meth)acrylate, isobutyl(meth)acrylate, n-pentyl(meth)acrylate, n-hexyl(meth)acrylate, n-decyl (meth)acrylate, 2-ethylhexyl(meth)acrylate, cyclohexyl (meth)acrylate, tricyclodecanyl(meth)acrylate and the like; alkyl(meth)acrylates containing a hydroxyl group such as hydroxymethyl(meth)acrylate, hydroxyethyl(meth)acrylate and the like; alkyl(meth)acrylates containing an epoxy group such as glycidyl(meth)acrylate and the like; alkyl(meth)acrylates containing an aryl group such as benzyl(meth)acrylate and the like; alkyl(meth)acrylates containing an amino group such as N,N-dimethylaminoethyl(meth)acrylate and the like. These can be used alone or in a combination thereof.

In an exemplary embodiment, the alkali-soluble resin include a compound represented by the following Chemical Formula 4.

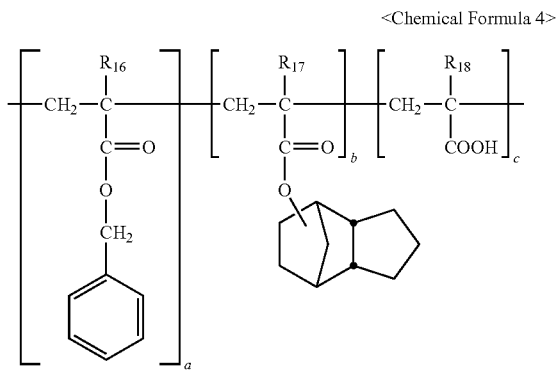

<Chemical Formula 4>

In Chemical Formula 4, $R_{16}$, $R_{17}$ and $R_{18}$ independently represent a hydrogen atom or an alkyl group having 1 to 4 carbon atoms (where a, b and c independently represent 1 to 99, and the total sum of a, b and c is 100). For example, according to an exemplary embodiment, the alkyl group include a methyl group, an ethyl group, an n-propyl group, an isopropyl group, an n-butyl group, an isobutyl group, a t-butyl group, etc.

Alternatively, according to another exemplary embodiment, the alkali-soluble resin include a compound represented by the following Chemical Formula 5.

<Chemical Formula 5>

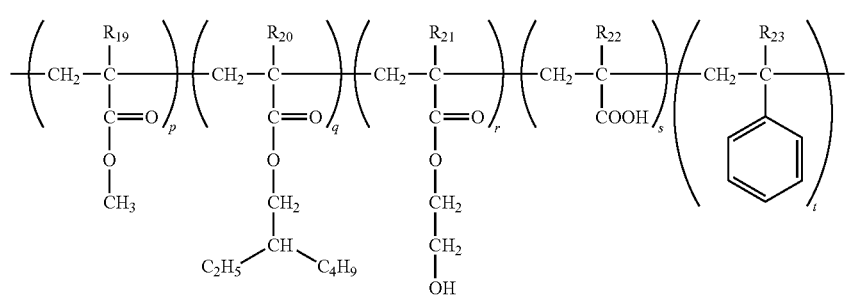

In Chemical Formula 5, $R_{19}$, $R_{20}$, $R_{21}$, $R_{22}$ and $R_{23}$ independently represent a hydrogen atom or an alkyl group having 1 to 4 carbon atoms (where p, q, r, s and t independently represent 1 to 99, and the total sum of p, q, r, s and t is 100). For example, according to an exemplary embodiment, the alkyl group include a methyl group, an ethyl group, an n-propyl group, an isopropyl group, an n-butyl group, an isobutyl group, a t-butyl group, etc.

According to an exemplary embodiment, the alkali-soluble resin have a polystyrene-reduced weight-average molecular weight of approximately 5,000 to approximately 50,000 when measured by gel permeation chromatography ("GPC").

According to an exemplary embodiment, the alkali-soluble resin is crosslinked at a temperature of approximately 200° C. to approximately 300° C.

When the content of the alkali-soluble resin is less than approximately 60% by weight based on a total weight of the thermosetting composition, the shape reproducibility of a cross-section of a pattern is reduced, and heat resistance is reduced. According to an exemplary embodiment, when the content of the alkali-soluble resin is more than approximately 99.9% by weight, photosensitivity and a dissolving rate in a developing solution is reduced. Thus, according to an exemplary embodiment, the content of the alkali-soluble resin is within a range of approximately 60% to approximately 99.9% by weight based on the total weight of the thermosetting composition, and preferably within a range of approximately 70% to approximately 98% by weight.

According to an exemplary embodiment, the thermosetting composition further includes a thermal crosslinker. The thermal crosslinker is reacted with an unreacted material remaining after exposure to light so that an amount of the unreacted material is reduced. According to an exemplary embodiment, the thermal crosslinker includes an epoxy-containing compound, a nitrogen-containing compound and the like. These can be used alone or in a combination thereof.

According to an exemplary embodiment, the epoxy-containing compound includes a (poly)glycidyl ether compound, a (poly)glycidyl ester compound, a (poly)glycidyl amine compound and the like. These can be used alone or in a combination thereof.

According to an exemplary embodiment, the (poly)glycidyl ether compound is prepared by reacting a monohydroxy compound or polyhydroxy compound with epichlorohydrin. The (poly)glycidyl ether compound includes diglycidyl ether epoxy of polyethylene glycol, diglycidyl ether epoxy of bis (4-hydroxyphenyl), diglycidyl ether epoxy of bis(3,5-dimethyl-4-hydroxyphenyl), diglycidyl ether epoxy of bisphenol-F, diglycidyl ether epoxy of bisphenol-A, diglycidyl ether epoxy of tetramethyl bisphenol-A, diglycidyl ether epoxy of ethylene oxide-added bisphenol-A, dihydroxyfluorene epoxy, dihydroxyalkylene oxyfluorene epoxy, bisphenol-A/aldehyde novolak epoxy, phenol novolak epoxy, cresol novolak epoxy and the like.

The (poly)glycidyl ester compound is prepared by reacting a (poly)carbonic acid compound with epichlorohydrin. According to an exemplary embodiment, the (poly)glycidyl ester compound includes diglycidyl ester epoxy of hexahydrophthalic acid, diglycidyl ester epoxy of phthalic acid and the like. The (poly)glycidyl amine compound is prepared by reacting a (poly)amino compound with epichlorohydrin. According to an exemplary embodiment, the (poly)amino compound includes glycidyl amine epoxy of bis(4-aminopheyl)methane, triglycidyl amine epoxy of isocyanic acid. These can be used alone or in a combination thereof.

According to an exemplary embodiment, the nitrogen-containing compound includes a compound prepared by reacting formalin with melamine, benzoguanamine, glycoluril, urea and the like, their alkyl derivatives and the like. These can be used alone or in a combination thereof.

According to an exemplary embodiment, a compound prepared by reacting formalin with melamine and their alkyl derivatives includes Cymel 300, Cymel 301, Cymel 303, Cymel 350, Cymel 736, Cymel 738, Cymel 370, Cymel 771, Cymel 325, Cymel 327, Cymel 703, Cymel 701, Cymel 266, Cymel 267, Cymel 285, Cymel 232, Cymel 235, Cymel 238, Cymel 1141, Cymel 272, Cymel 254, Cymel 202, Cymel 1156, Cymel 1158 (trade name, manufactured by Cytec Industries Inc., Japan), Nikalac E-2151, Nikalac MW-100LM, Nikalac MX-750LM (trade name, manufactured by Sanwa Chemical Co., Ltd., Japan) and the like. Examples of a compound prepared by reacting formalin with benzoguanamine and their alkyl derivatives may include Cymel 1123, Cymel 1125, Cymel 1128 (trade name, manufactured by Cytec Industries Inc., Japan), Nikalac MX-270 (trade name, manufactured by Sanwa Chemical Co., Ltd., Japan) and the like. According to an exemplary embodiment, a compound prepared by reacting formalin with urea and their alkyl derivatives includes UFR 65300 (trade name, manufactured by Cytec Industries Inc., Japan), Nikalac MX-290 (trade name, manufactured by Sanwa Chemical Co., Ltd., Japan) and the like. These can be used alone or in a combination thereof.

According to an exemplary embodiment, when the content of the thermal crosslinker is less than approximately 0.1% by weight based on the total weight of the thermosetting composition, the hardness of an organic layer is reduced, and unreacted residue is increasingly formed in the organic layer so that an amount of outgassing is increased. According to an exemplary embodiment, when the content of the thermal crosslinker is more than approximately 40% by weight, the resolution may be deteriorated. Thus, according to an exemplary embodiment, the content of the thermal crosslinker is within a range of approximately 0.1% to approximately 40% by weight based on the total weight of the thermosetting composition, and is preferably within a range of approximately 2% to approximately 30%.

Regarding the organic solvent, according to an exemplary embodiment, the organic solvent includes methyl cellosolve, ethyl cellosolve, butyl cellosolve, diethylene glycol monomethyl ether, propylene glycol monoacetate, propylene glycol diacetate, propylene glycol monomethyl ether acetate, methyl ethyl ketone, methyl isobutyl ketone, cyclohexanone, toluene, chloroform, dichloromethane, ethyl acetate, ethyl lactate, methyl lactate, 3-methoxymethyl propionate, 3-ethoxyethyl propionate, propylene glycol monomethyl ether, methanol, ethanol, propanol, butanol, tetrahydrofuran, diethylene glycol dimethyl ether, methoxybutyl ester acetate, Solvesso, carbitol and the like. These can be used alone or in a combination thereof.

The boiling point of the organic solvent is within a range of approximately 100° C. to approximately 200° C., and is preferably within a range of approximately 120° C. to approximately 170° C.

According to an exemplary embodiment, when the content of the thermosetting composition is less than approximately 50 parts by weight with respect to the photocurable composition of approximately 100 parts by weight, the hardness of an organic layer is reduced. When the content of the thermosetting composition is more than approximately 200 parts by weight with respect to the photocurable composition of approximately 100 parts by weight, the resolution is deteriorated. Thus, the content of the thermosetting composition is within a range of approximately 50 parts to approximately 200 parts by weight with respect to the photocurable composition of approximately 100 parts by weight, and is preferably within a range of approximately 70 parts to approximately 120 parts by weight.

The solid content of the negative photoresist composition including the thermosetting composition and the photocurable composition is within a range of approximately 5% to approximately 60% by weight, and is preferably within a range of approximately 10% to approximately 50% by weight.

According to an exemplary embodiment, the content of the organic solvent is approximately 40% to approximately 95% by weight based on the total weight of the negative photoresist composition, and is preferably within a range of approximately 50% to approximately 90% by weight. When the solid content of the negative photoresist composition is less than approximately 5% by weight, the viscosity of negative photoresist composition is reduced so that dropping of the negative photoresist composition on a substrate may be difficult to control. When the solid content of the negative photoresist composition is more than approximately 60% by weight, the viscosity of negative photoresist composition is increased so that coating of the negative photoresist composition on a substrate may be difficult to control.

The negative photoresist composition according to an exemplary embodiment of the present invention may improve photosensitivity, resolution, adhesion and detachability after performing a operation so as to form a pattern having a desired shape, and reduce residue formed in an organic insulation layer so as to improve the reliability of the organic insulation layer. Furthermore, the negative photoresist composition forms an organic insulation layer having high transmittance and reduces the variation of color coordinates of a display apparatus, thereby improving the display quality of the display apparatus.

Hereinafter, a negative photoresist composition according to an exemplary embodiment of the present invention will be described with reference to examples for illustrations purposes only. The present invention is not limited by the following examples and may vary accordingly.

EXAMPLE 1

(A) Approximately 100 parts by weight of a photocurable composition including about 93.2% by weight of an ethylene unsaturated compound represented by the following Chemical Formula 6, about 3.9% by weight of a photopolymerization initiator represented by the following Chemical Formula 7 and about 2.9% by weight of 2-mercaptobenzothiazole and (B) approximately 100 parts by weight of a thermosetting composition including approximately 94.1% by weight of an alkali-soluble resin represented by the following Chemical Formula 8 and approximately 5.9% by weight of a thermal crosslinker resin represented by the following Chemical Formula 9 were mixed. A solid content of the mixture was dissolved in approximately 370 parts by weight of propylene glycol monomethyl ether acetate (PGMAc) to prepare a negative photoresist composition. The solid content of the negative photoresist composition was approximately 35% by weight.

<Chemical Formula 6>

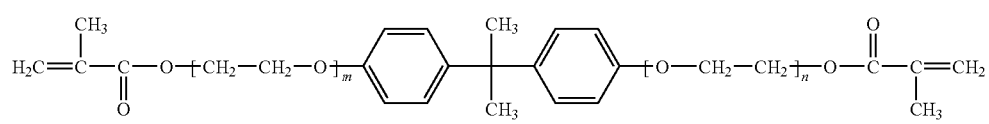

In Chemical Formula 6, m represents 2, and n represents 3. According to an exemplary embodiment, the compound represented by Chemical Formula 6 includes Light Ester BP-2EM (trade name, manufactured by Kyoeisha Chemical Co., Ltd., Japan).

<Chemical Formula 7>

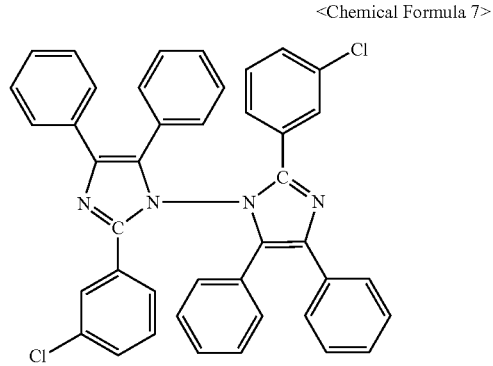

<Chemical Formula 8>

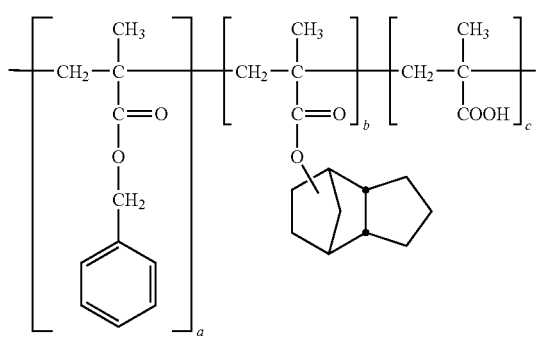

In Chemical Formula 8, a represents 50, b represents 20, and c represents 30. The weight-average molecular weight was approximately 17,000.

<Chemical Formula 9>

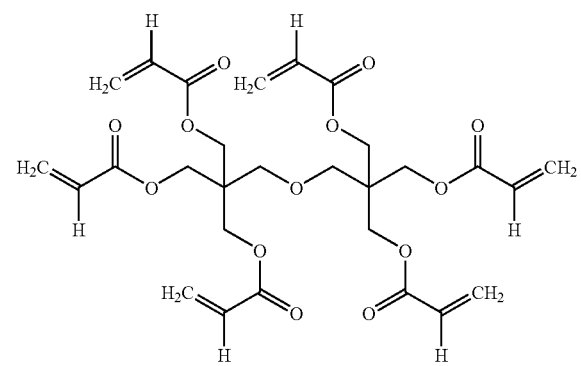

According to an exemplary embodiment, the compound represented by Chemical Formula 9 includes Nikalac MW-100LM (trade name, manufactured by Sanwa Chemical Co., Ltd., Japan).

EXAMPLE 2

(A) Approximately 100 parts by weight of a photocurable composition including approximately 93.2% by weight of an ethylene unsaturated compound represented by the following Chemical Formula 10, approximately 3.9% by weight of a photopolymerization initiator represented by Chemical Formula 7 and approximately 2.9% by weight of 2-mercaptobenzothiazole and (B) approximately 100 parts by weight of a thermosetting composition including approximately 94.1% by weight of an alkali-soluble resin represented by Chemical Formula 8 and approximately 5.9% by weight of a thermal crosslinker resin represented by Chemical Formula 9 were mixed. A solid content of the mixture was dissolved in approximately 370 parts by weight of propylene glycol monomethyl ether acetate (PGMAc) to prepare a negative photoresist composition. The solid content of the negative photoresist composition was about 35% by weight.

<Chemical Formula 10>

According to an exemplary embodiment, the compound represented by Chemical Formula 10 includes Kayarad DPHA (trade name, manufactured by Nippon Kayaku Co., Ltd., Japan).

EXAMPLE 3

(A) Approximately 100 parts by weight of a photocurable composition including approximately 93.2% by weight of an ethylene unsaturated compound represented by Chemical Formula 6, approximately 3.9% by weight of a photopolymerization initiator represented by Chemical Formula 7 and approximately 2.9% by weight of 2-mercaptobenzothiazole and (B) approximately 100 parts by weight of a thermosetting composition including approximately 94.1% by weight of an alkali-soluble resin represented by the following Chemical Formula 11 and approximately 5.9% by weight of a thermal crosslinker resin represented by Chemical Formula 9 were mixed. A solid content of the mixture was dissolved in approximately 370 parts by weight of propylene glycol monomethyl ether acetate (PGMAc) to prepare a negative photoresist composition. The solid content of the negative photoresist composition was about 35% by weight.

<Chemical Formula 11>

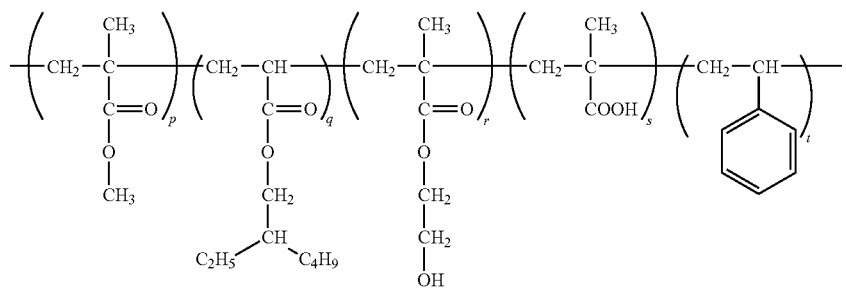

In Chemical Formula 11, p represents 33, q represents 16, r represents 11, s represents 26 and t represents 14. The weight-average molecular weight was approximately 45,000.

COMPARATIVE EXAMPLE 1

(A) Approximately 100 parts by weight of a photocurable composition including approximately 93.2% by weight of an ethylene unsaturated compound represented by Chemical Formula 6, approximately 3.9% by weight of a photopolymerization initiator represented by Chemical Formula 7 and approximately 2.9% by weight of 2-mercaptobenzothiazole and (B) approximately 93 parts by weight of a thermosetting composition including about 100% by weight of an alkali-soluble resin represented by Chemical Formula 8 were mixed. A solid content of the mixture was dissolved in about 370 parts by weight of propylene glycol monomethyl ether acetate (PGMAc) to prepare a negative photoresist composition. The solid content of the negative photoresist composition was approximately 34% by weight.

COMPARATIVE EXAMPLE 2

(A) Approximately 100 parts by weight of a photocurable composition including approximately 93.2% by weight of an ethylene unsaturated compound represented by Chemical Formula 10, approximately 3.9% by weight of a photopolymerization initiator represented by Chemical Formula 7 and approximately 2.9% by weight of 2-mercaptobenzothiazole and (B) approximately 93 parts by weight of a thermosetting composition including approximately 100% by weight of an alkali-soluble resin represented by the following Chemical Formula 12 were mixed. A solid content of the mixture was dissolved in approximately 370 parts by weight of propylene glycol monomethyl ether acetate (PGMAc) to prepare a negative photoresist composition. The solid content of the negative photoresist composition was approximately 34% by weight.

zole and (B) approximately 208 parts by weight of a thermosetting composition including approximately 94.1% by weight of an alkali-soluble resin represented by Chemical Formula 8 and approximately 5.9% by weight of a thermal crosslinker resin represented by Chemical Formula 9 were mixed. A solid content of the mixture was dissolved in approximately 848 parts by weight of propylene glycol monomethyl ether acetate (PGMAc) to prepare a negative photoresist composition.

COMPARATIVE EXAMPLE 4

PC-411B (trade name, manufactured by JSR Corp., Japan) as a positive photoresist composition was prepared.

Experiment—Evaluation of Photoresist Composition

Photoresist compositions of Examples 1 to 3 and Comparative Examples 1 to 4 were respectively coated on a base substrate, pre-baked, exposed to light and developed to form organic layers. Thereafter, the transmittance, color, minimum exposure amount, amount of outgassing, resolution, shape of a pattern, residue, detachability, and hardness, of each of the organic layers were measured. Thus obtained results are illustrated in the following Table 1.

The base substrate was a glass substrate. The thickness of the organic layers was approximately 4 μm. The organic layers were pre-baked at a temperature of approximately 90° C. for approximately 90 seconds. The photoresist compositions were coated on the base substrate by a spin-coating method. A mask having a pattern, of which a width was approximately 10 μm to approximately 50 μm, was used in the exposure process. The organic layers were exposed to light by using a high-pressure mercury lamp disposed on the mask. The base substrate having the organic layer was dipped in a tetramethylammonium hydroxide solution of approximately 0.4% by weight at a temperature of approximately 25°

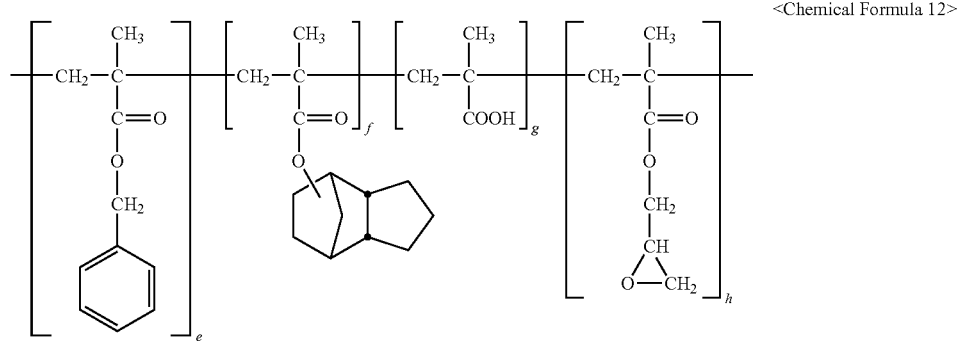

<Chemical Formula 12>

In Chemical Formula 12, e represents 30, f represents 20, g represents 30 and h represents 20. The weight-average molecular weight was approximately 17,000.

COMPARATIVE EXAMPLE 3

(A) Approximately 14 parts by weight of a photocurable composition including about 57% by weight of an ethylene unsaturated compound represented by Chemical Formula 7 and approximately 43% by weight of 2-mercaptobenzothia- C. for approximately 70 seconds. Thereafter, the base substrate having the organic layer was rinsed by deionized (DI) water to form a pattern. The pattern was exposed to light by a light amount of approximately 50 mJ/cm², and then heated in an oven at a temperature of 220° C. for approximately 1 hour. After being developed, the organic layers were dipped in N-methylpyrrolidone at a temperature of approximately 60° C. for approximately 10 minutes, and then evaluated as to how easily the pattern detached. The hardness of the organic layers was measured according to JIS K-5400.

TABLE 1

| | Example 1 | 2 | 3 | Comparative Example 1 | 2 | 3 | 4 |
|---|---|---|---|---|---|---|---|
| Transmittance (%) | 92 | 93 | 92 | 93 | 89 | — | 88 |
| Color | Transparent | Transparent | Transparent | Transparent | Transparent | Transparent | Yellow |
| Minimum exposure amount (mJ/cm$^2$) | 70 | 70 | 70 | 70 | 140 | — | 300 |
| Outgassing (%) | 20 | 8 | 10 | 60 | 70 | 140 | 100 |
| Resolution (μm) | 5 | 5 | 7 | 5 | 5 | — | 5 |
| Shape of pattern | Good | Good | Good | Good | Good | — | Good |
| Residue | Little | Little | Little | Little | Little | — | Little |
| Detachability | Good | Good | Good | Good | Good | — | Good |
| Hardness | 3H | 5H | 5H | Less than H | 3H | — | 3H |

In Table 1, the transmittance was obtained from the results of measuring a minimum transmittance of the organic layers in a wavelength range of approximately 300 nm to approximately 900 nm by using a UV3100PC spectrometer (trade name, Shimadzu Corp., Japan). Referring to Table 1, it can be noted that the organic layers of Examples 1 to 3 and Comparative Examples 1 and 2 had greater transmittance compared to the organic layer of Comparative Example 4. Furthermore, it can be noted that the organic layers of Examples 1 to 3 had greater transmittance compared to the organic layer of Comparative Example 2 using the alkali-soluble resin containing an epoxy group.

Referring to Table 1, the organic layer of Comparative Example 4 showed a yellow color after being developed since the negative photoresist composition of Comparative Example 4 used diazonaphthoquinone as a photosensitizer, the diazonaphthoquinone containing an azo group showing a red color. However, the organic layers of Examples 1 to 3 and Comparative Examples 1 to 3 were transparent. Thus, it can be noted that the organic layers of Examples 1 to 3 and Comparative Examples 1 to 3 may reduce the variation of color coordinates of a display apparatus.

In the case of the organic layer of Comparative Example 4, the minimum exposure amount represents an amount of light exposure needed when the organic layer does not remain after being developed. In order to set the minimum exposure amount of the organic layers of Examples 1 to 3 and Comparative Examples 1 to 3, the organic layers were respectively exposed to light by a high-pressure mercury lamp, the light having an exposure amount determined according to each interval, into which a range of approximately 10 mJ/cm$^2$ to approximately 100 mJ/cm$^2$ was divided by 2^(½) times. Thereafter, the base substrate having the organic layer was dipped in a tetramethylammonium hydroxide solution of approximately 0.4% by weight at a temperature of approximately 25° C. for approximately 70 seconds, and then rinsed. Thereafter, the thickness of a remaining organic layer was measured. Thus obtained results were plotted with respect to the exposure amounts of the intervals. The minimum exposure amount represents the exposure amount of the interval when the thickness difference between the interval and the previous interval was less than 10%.

Referring to Table 1, it can be noted that the minimum exposure amount needed for forming a pattern from the organic layers of Examples 1 to 3 was less than the minimum exposure amount needed for forming a pattern from the organic layers of Comparative Examples 2 and 4. Since the photoresist composition of Comparative Example 3 did not include a resin polymerized by light, the organic layer of Comparative Example 3 could not form a pattern. Referring to Table 1, it can be noted that the photosensitivity of a negative photoresist composition was greater than that of a positive photoresist composition.

The outgassing represents an amount of low molecular weight material measured by a GCMS-QP5050A gas chromatograph mass spectrometer (trade name, Shimadzu Corp., Japan) while the organic layer was heated at a temperature of approximately 240° C. for approximately 30 minutes. Referring to Table 1, it can be noted that the outgassing of the organic layers of Examples 1 to 3 including an ethylene unsaturated compound was much less than the outgassing of the organic layers of Comparative Examples 1, 2 and 4.

When the hardness of the organic layer is equal to or greater than approximately 3H, the organic layer may have sufficient hardness to act as a protective layer for a substrate. Referring to Table 1, the hardness levels of the organic layers of Examples 1 to 3 were greater than the hardness level of the organic layer of Comparative Example 1.

Hereinafter a method of manufacturing an array substrate according to an exemplary embodiment of the present invention will be described with reference to FIGS. 1, 2, 3, 4, 5 and 6.

FIG. 1 is a cross-sectional view illustrating an operation of forming a gate pattern according to an exemplary embodiment of the present invention.

Referring to FIG. 1, a gate metal layer is formed on a base substrate 110, and patterned to form a gate pattern including a gate line, a gate electrode 120 extended from the gate line and a storage line. According to an exemplary embodiment, the gate metal layer is patterned through a photolithography.

Figure 2:
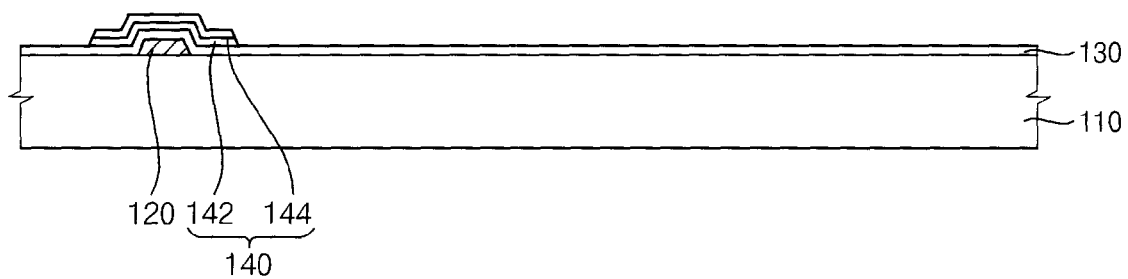
FIG. 2 is a cross-sectional view illustrating an exemplary embodiment of an operation of forming a gate insulation layer and a channel pattern of a method of manufacturing an array substrate according to the present invention.

FIG. 2 is a cross-sectional view illustrating an operation of forming a gate insulation layer and a channel pattern according to an exemplary embodiment of the present invention.

Referring to FIG. 2, the gate insulation layer 130 is formed on the base substrate 110 having the gate pattern. According to an exemplary embodiment, the material used for the gate insulation layer 130 includes silicon nitride, silicon oxide and the like.

A channel pattern 140 is formed by sequentially forming a semiconductor layer 142 and an ohmic contact layer 144 are on the base substrate 110 having the gate insulation layer 130. According to an exemplary embodiment, a material used for the semiconductor layer 142 includes amorphous silicon (a-Si). According to an exemplary embodiment, a material used for the ohmic layer 142 includes n$^+$ amorphous silicon (n$^+$ a-Si), into which n-type impurities are implanted at a high concentration. The semiconductor layer 142 and the ohmic contact layer 144 are patterned through a photolithography operation to form the channel pattern 140.

Figure 3:
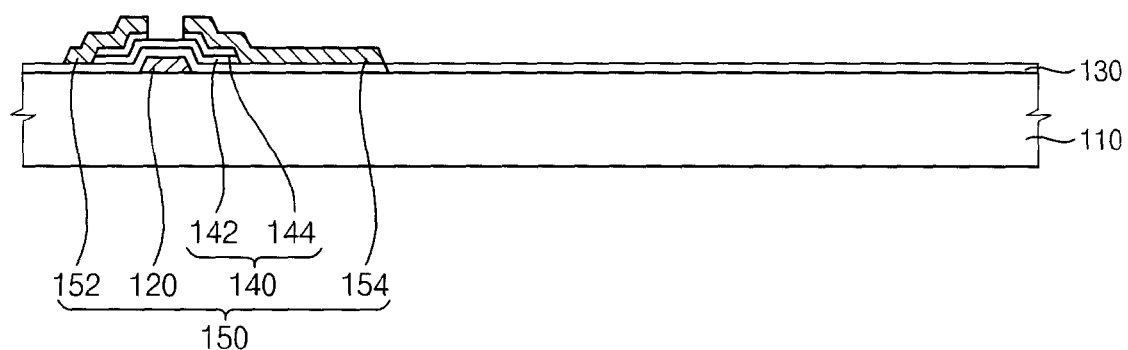
FIG. 3 is a cross-sectional view illustrating an exemplary embodiment of an operation of forming a source pattern of a method of manufacturing an array substrate according to the present invention.

FIG. 3 is a cross-sectional view illustrating an operation of forming a source pattern according to an exemplary embodiment of the present invention.

Referring to FIG. 3, a source metal layer is formed on the base substrate 110 having the channel pattern 140. The source metal layer is patterned to form a source pattern 150 including a data line crossing the gate line, a source electrode 152 extended from the data line and a drain electrode 154 spaced apart from the source electrode 152. According to an exemplary embodiment, a mask used for patterning the source metal layer is different from the mask used for forming the channel pattern 140.

Alternatively, according to an exemplary embodiment, the source pattern 150 is formed by using the mask used for forming the channel pattern 140. For example, the semiconductor layer 142, the ohmic contact layer 144 and the source metal layer are sequentially formed on the base substrate 110 having the gate insulation layer 130. Thereafter, a photopattern is formed on the source metal layer by using a mask having a slit portion or a half-transmitting portion. The source metal layer, the ohmic contact layer 144 and the semiconductor layer 142 are patterned by using the photopattern to thereby form a channel pattern 140 and a source pattern.

Figure 4:
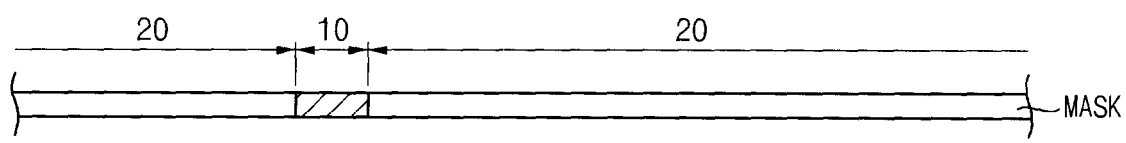
FIG. 4 is a cross-sectional view illustrating an exemplary embodiment of an operation of forming an organic insulation layer of a method of manufacturing an array substrate according to the present invention.
Figure 4:
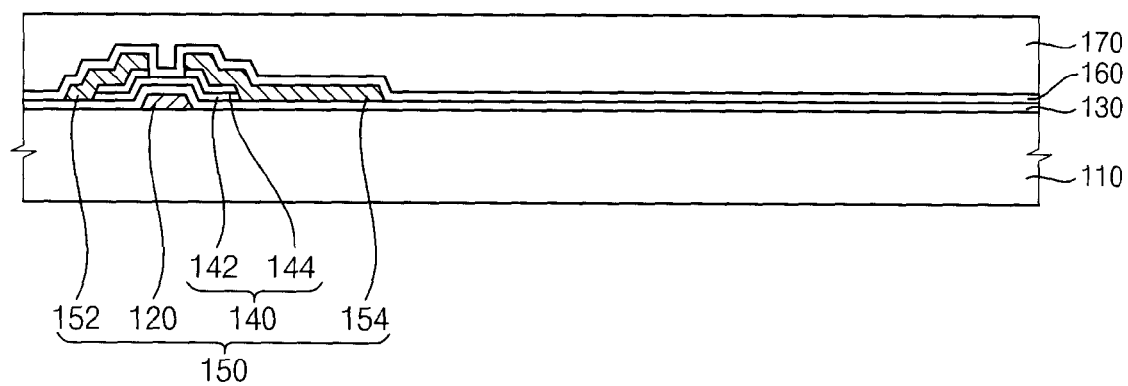

FIG. 4 is a cross-sectional view illustrating an operation of forming an organic insulation layer according to an exemplary embodiment of the present invention.

Referring to FIG. 4, a passivation layer 160 is formed on the base substrate 110 having the source pattern 150. A negative photoresist composition is coated on the passivation layer 160 to form an organic insulation layer 170.

According to an exemplary embodiment, a material of the passivation layer 160 includes silicon nitride, silicon oxide and the like.

According to an exemplary embodiment, the negative photoresist composition includes a photocurable composition including an ethylene unsaturated compound containing an ethylene unsaturated bond and a photopolymerization initiator, a thermosetting composition including an alkali-soluble resin crosslinked by heat, and an organic solvent. The negative photoresist composition further includes a thermal crosslinker. The photo polymerization initiator generates a radical in response to light having a wavelength range of approximately 300 nm to approximately 450 nm.

For example, the negative photoresist composition may include (A) approximately 100 parts by weight of a photocurable composition including approximately 93.2% by weight of an ethylene unsaturated compound represented by the above-described Chemical Formula 6, approximately 3.9% by weight of a photopolymerization initiator represented by the above-described Chemical Formula 7 and approximately 2.9% by weight of 2-mercaptobenzothiazole and (B) approximately 100 parts by weight of a thermosetting composition including approximately 94.1% by weight of an alkali-soluble resin represented by the above-described Chemical Formula 8 and approximately 5.9% by weight of a thermal crosslinker resin represented by the above-described Chemical Formula 9. A solid content of the mixture may be dissolved in approximately 370 parts by weight of propylene glycol monomethyl ether acetate (PGMAc) to prepare a negative photoresist composition. The solid content of the negative photoresist composition may be approximately 35% by weight. The negative photoresist composition is substantially the same as Example of the present invention explained on the above. Thus, any further explanation will be omitted.

According to an exemplary embodiment, the negative photoresist composition is dropped and coated on the base substrate 110 having the passivation layer 160 (see FIG. 4, for example). According to an exemplary embodiment, the negative photoresist composition is coated by using a coating device such as a spinner, a wire bar, a flow coater, a roll coater, a spray, for example. The thickness of the negative photoresist composition may be approximately 0.5 μm to approximately 5 μm.

Thereafter, the negative photoresist composition coated on the base substrate 110 is dried. According to an exemplary embodiment, a drying operation is performed by using a vacuum drier, a hot plate, an infrared oven, a convection oven and the like at a temperature of approximately 40° C. to approximately 150° C. for approximately 10 seconds to approximately 600 seconds.

As shown in FIG. 4, a mask MASK is disposed on the negative photoresist composition coated on the base substrate 110, and light is irradiated onto the negative photoresist composition through the mask MASK. The mask MASK includes a light-blocking part 10 corresponding to a transmitting part 20 corresponding to an end of the drain electrode 154 and a transmitting part 20 corresponding to a remaining region of a pixel except for the end of the drain electrode 154. According to an exemplary embodiment, a lamp that is used for the exposure operation includes a lamp light source such as a xenon lamp, a halogen lamp, a tungsten lamp, a high-pressure mercury lamp, a super high-pressure mercury lamp, a metal halide lamp, a medium-pressure mercury lamp, a low-pressure mercury lamp and the like; and a laser light source such as an argon ion laser, an ytterbium-aluminum-garnet (YAG) laser, an excimer laser, a nitrogen laser and the like. According to an exemplary embodiment, a high-pressure mercury lamp providing light having a wavelength of approximately 300 nm to approximately 450 nm is used.

When light is irradiated onto the negative photoresist composition, the photopolymerization initiator generates a radical to polymerize the ethylene unsaturated compound.

The negative photoresist composition has an improved ability to absorb light. Thus, the negative photoresist composition reduces the time required for the exposure operation. For example, the time required for the exposure operation is reduced by two-thirds compared to a conventional positive photoresist composition. The thermosetting composition of the negative photoresist composition may be cured by using the light as heat energy. Thus, a portion of the negative photoresist composition, which is exposed to light, is cured, and a remaining portion of the negative photoresist composition corresponding to the light-blocking part 10 is not cured. Thus, an organic insulation layer 170 is formed on the passivation layer 160.

Figure 5:
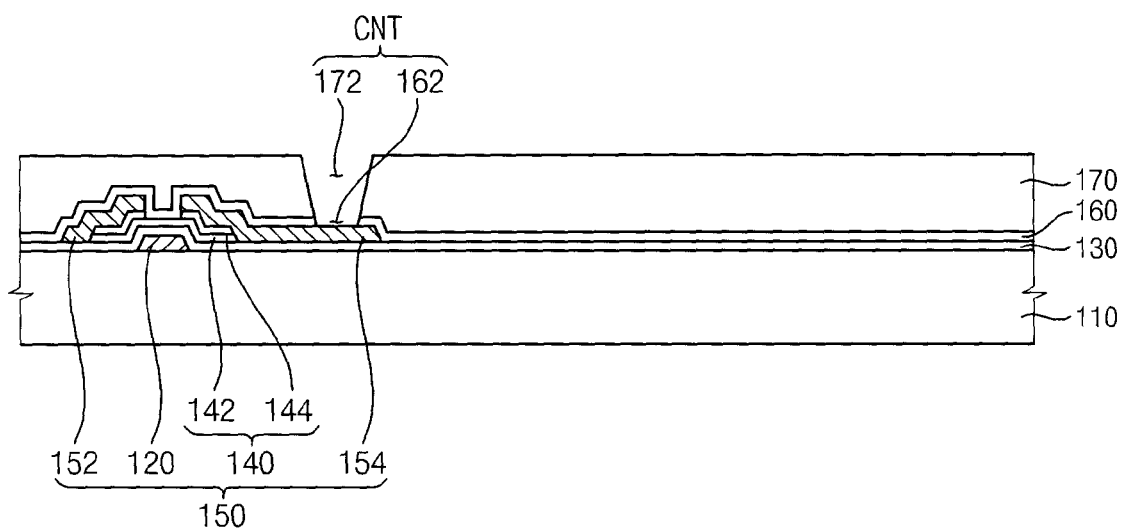
FIG. 5 is a cross-sectional view illustrating an operation of developing an organic insulation layer of a method of manufacturing an array substrate according to the present invention.

FIG. 5 is a cross-sectional view illustrating an operation of developing an organic insulation layer according to an exemplary embodiment of the present invention.

Referring to FIG. 5, the organic insulation layer 170 is developed to form an opening 172. The passivation layer 160 formed on the drain electrode 154 is exposed through the opening formed through the organic insulation layer 170.

According to an exemplary embodiment, a developing solution used for a developing operation includes an alkaline solution. For example, the developing solution includes a inorganic alkaline compound such as sodium carbonate, sodium hydrogen carbonate, potassium carbonate, potassium hydrogen carbonate, sodium silicate, potassium silicate, sodium hydroxide, potassium hydroxide and the like; an organic alkaline compound such as diethanol amine, triethylamine, triethanol amine, tetramethylammonium hydroxide and the like. These can be used alone or in a combination thereof. The developing solution further includes a surfactant, an aqueous organic solvent, a wetting agent, a low molecular weight compound containing a hydroxyl group or a carboxyl group. The surfactant includes an ionic surfactant containing naphthalene sulfonic acid sodium, benzene sulfonic acid sodium and the like; a non-ionic surfactant containing a polyalkylene oxide group; and an anionic surfactant containing a tetraalkylammonium group. According to an exemplary embodiment, the organic insulation layer 170 is developed at a temperature of approximately 10° C. to approximately 50° C. by dipping, spraying, brushing, ultrasonic waves and the like. The negative photoresist composition reduces residue formed adjacent to the opening 172 after the developing solution.

Thereafter, the passivation layer 160 is etched through the organic insulation layer 170 having the opening 172 to form a hole 162 through the passivation layer 160. The hole 162 overlaps with the opening 172. For example, according to an exemplary embodiment, the passivation layer 160 is dry-etched such that the end of the drain electrode 154 is exposed through the hole 162. The opening 172 and the hole 162 form a contact hole CNT.

Alternatively, according to another exemplary embodiment, after the passivation layer 160 is formed and then etched to form the hole 162, the organic insulation layer 170 is formed and then patterned to form the opening 172 so as to form the contact hole CNT. Thus, a mask for patterning the passivation layer 160 and a mask for patterning the organic insulation layer 170 are independently used.

Thereafter, the base substrate 110 is heated for a curing operation. For example, the base substrate 110 is heated by a hot plate, an infrared oven, a convection oven and the like at a temperature of approximately 200° C. to approximately 300° C. for approximately 30 seconds to approximately 540 minutes. Unreacted material remaining in the organic insulation layer 170 is cured through the curing operation. Thus, outgassing of the organic insulation layer 170 is reduced. The organic insulation layer 170 has a hardness equal to or greater than approximately 3H. Thus, the gate pattern and the source pattern 150 are chemically and/or physically protected. Furthermore, an array substrate is planarized.

Figure 6:
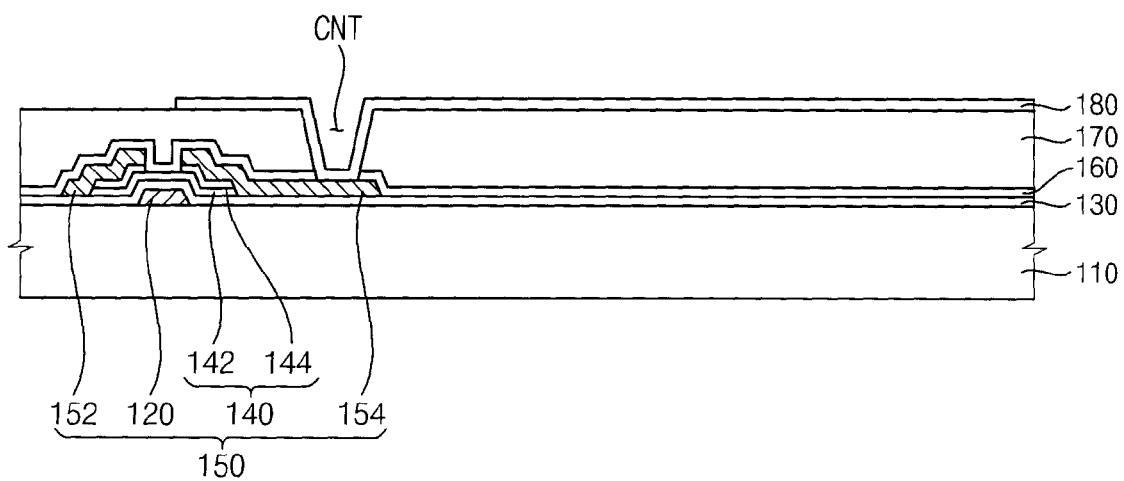
FIG. 6 is a cross-sectional view illustrating an exemplary embodiment of an operation of forming a pixel electrode of a method of manufacturing an array substrate according to the present invention.

FIG. 6 is a cross-sectional view illustrating a an operation of forming a pixel electrode according to an exemplary embodiment of the present invention.

Referring to FIG. 6, a transparent electrode layer is formed on the organic insulation layer 170. The transparent electrode layer is patterned to form a pixel electrode 180 making contact with and being electrically connected to the drain electrode 154 through the contact hole CNT. According to an exemplary embodiment, a material used for the pixel electrode 180 includes indium tin oxide (ITO), Indium zinc oxide (IZO) and the like.

While the present invention has been shown and described with reference to some exemplary embodiments thereof, it should be understood by those of ordinary skill in the art that various changes in form and details may be made therein without departing from the spirit and the scope of the present invention as defined by the appending claims.

What is claimed is:

1. A negative photoresist composition comprising:
   a photocurable composition including
      an ethylene unsaturated compound having an ethylenic unsaturated bond, and
      a photopolymerization initiator;
   a thermosetting composition including an alkali-soluble resin; and
   an organic solvent,
   wherein the alkali-soluble resin comprises a compound represented by Chemical Formula 5:

Chemical Formula 5

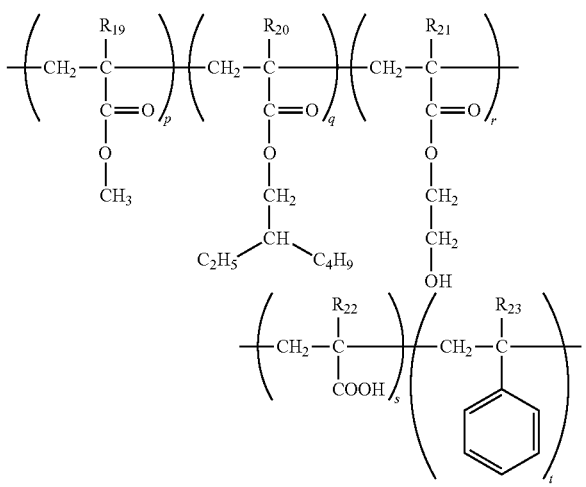

wherein $R_{19}$, $R_{20}$, $R_{21}$, $R_{22}$ and $R_{23}$ independently represent a hydrogen atom or an alkyl group having 1 to 4 carbon atoms wherein p, q, r, s and t are independently 1 to 99, and wherein the total sum of p, q, r, s and t is 100.

2. The negative photoresist composition of claim 1, wherein the ethylene unsaturated compound comprises at least two (meth)acrylate groups.

3. The negative photoresist composition of claim 1, wherein the alkali-soluble resin includes a weight-average molecular weight of approximately 5,000 to approximately 50,000.

4. The negative photoresist composition of claim 1, wherein a sum of the photocurable composition and the thermosetting composition is approximately 5% to approximately 60% by weight based on the negative photoresist composition.

5. The negative photoresist composition of claim 1, wherein a weight ratio of the photocurable composition to the thermosetting composition is approximately 1:0.5 to approximately 1:2.

6. The negative photoresist composition of claim 1, wherein the thermosetting composition further includes a thermal crosslinker to link the alkali-soluble resin.

7. The negative photoresist composition of claim 1, wherein the photopolymerization initiator is capable of generating a radical when irradiated with light having a wavelength of approximately 300 nm to approximately 450 nm.

* * * * *